(12) United States Patent
Lim

(10) Patent No.: US 9,559,223 B2
(45) Date of Patent: Jan. 31, 2017

(54) SOLAR CELL APPARATUS AND METHOD OF FABRICATING THE SAME

(71) Applicant: LG INNOTEK CO., LTD., Seoul (KR)

(72) Inventor: Chin Woo Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 36 days.

(21) Appl. No.: 14/352,802

(22) PCT Filed: Oct. 16, 2012

(86) PCT No.: PCT/KR2012/008447
§ 371 (c)(1),
(2) Date: Apr. 18, 2014

(87) PCT Pub. No.: WO2013/058524
PCT Pub. Date: Apr. 25, 2013

(65) Prior Publication Data
US 2014/0261678 A1    Sep. 18, 2014

(30) Foreign Application Priority Data
Oct. 18, 2011 (KR) .......................... 10-2011-0106373

(51) Int. Cl.
H01L 31/0224    (2006.01)
H01L 31/0463    (2014.01)
H01L 31/0465    (2014.01)

(52) U.S. Cl.
CPC ..... *H01L 31/02245* (2013.01); *H01L 31/0463* (2014.12); *H01L 31/0465* (2014.12); *Y02E 10/50* (2013.01)

(58) Field of Classification Search
None
See application file for complete search history.

(56) References Cited

U.S. PATENT DOCUMENTS

2007/0193619 A1    8/2007  Shinohara
2009/0301543 A1*  12/2009  Reddy .................. H01L 31/046
                                                          136/244

FOREIGN PATENT DOCUMENTS

| CN | 101165923 A | 4/2008 |
| CN | 101443921 A | 5/2009 |
| JP | 2007-227577 A | 9/2007 |

(Continued)

OTHER PUBLICATIONS

Society of Manufacturing Engineers "Holemaking" Fundamental Manufacturing Processes Study Guide, DVO9PUB3, www.sme.org/WorkArea/DownloadAsset.aspx?id=73764 accessed Sep. 30, 2015.*

(Continued)

*Primary Examiner* — Magali P Slawski
(74) *Attorney, Agent, or Firm* — Saliwanchik, Lloyd & Eisenschenk

(57) ABSTRACT

According to the embodiment, there is provided a solar cell apparatus. The solar cell apparatus includes a back electrode layer on a substrate, a light absorbing layer on the back electrode layer, a buffer layer on the light absorbing layer, a front electrode layer on the buffer layer, and a connection part making contact with the front electrode layer, passing through the light absorbing layer, and making contact with the back electrode layer. The connection part includes a material different from a material constituting the front electrode layer.

7 Claims, 4 Drawing Sheets

(56) References Cited

FOREIGN PATENT DOCUMENTS

| | | |
|---|---|---|
| KR | 10-2009-0125675 A | 12/2009 |
| KR | 1020100109314 A | 10/2010 |
| KR | 10-1044680 B1 | 6/2011 |
| KR | 10-1054988 B1 | 8/2011 |

OTHER PUBLICATIONS

International Search Report in International Application No. PCT/KR2012/008447, filed Oct. 16, 2012.
Office Action dated Oct. 10, 2015 in Chinese Application No. 201280062252.6.

* cited by examiner

SOLAR CELL APPARATUS AND METHOD OF FABRICATING THE SAME

CROSS-REFERENCE TO RELATED APPLICATIONS

This application is the U.S. national stage application of International Patent Application No. PCT/KR2012/008447, filed Oct. 16, 2012, which claims priority to Korean Application No. 10-2011-0106373, filed Oct. 18, 2011, the disclosures of each of which are incorporated herein by reference in their entirety.

TECHNICAL FIELD

The embodiment relates to a solar cell apparatus and a method of fabricating the same.

BACKGROUND ART

A method of fabricating a solar cell for solar light power generation is as follows. First, after preparing a substrate, a back electrode layer is formed on the substrate and patterned by a laser, thereby forming a plurality of back electrodes.

Thereafter, a light absorbing layer, a buffer layer, and a high resistance buffer layer are sequentially formed on the back electrodes. Various schemes, such as a scheme of forming a Cu(In,Ga)Se2 (CIGS) based-light absorbing layer by simultaneously or separately evaporating Cu, In, Ga, and Se and a scheme of performing a selenization process after a metallic precursor film has been formed, have been extensively used in order to form the light absorbing layer. The energy band gap of the light absorbing layer is in the range of about 1 eV to about 1.8 eV.

Then, a buffer layer including cadmium sulfide (CdS) is formed on the light absorbing layer through a sputtering process. The energy bandgap of the buffer layer may be in the range of about 2.2 eV to about 2.4 eV. After that, a high resistance buffer layer including zinc oxide (ZnO) is formed on the buffer layer through the sputtering process. The energy bandgap of the high resistance buffer layer is in the range of about 3.1 eV to about 3.3 eV.

Thereafter, a groove pattern may be formed in the light absorbing layer, the buffer layer, and the high resistance buffer layer.

After that, a transparent conductive material is laminated on the high resistance buffer layer, and is filled in the groove pattern. Therefore, a transparent electrode layer is formed on the high resistance buffer layer, and connection wires are formed in the groove pattern. A material constituting the transparent electrode layer and the connection wireless may include aluminum doped zinc oxide (AZO). The energy bandgap of the transparent electrode layer may be in the range of about 3.1 eV to about 3.3 eV.

Then, the groove pattern is formed in the transparent electrode layer, so that a plurality of solar cells may be formed. The transparent electrodes and the high resistance buffers correspond to the cells, respectively. The transparent electrodes and the high resistance buffers may be provided in the form of a stripe or a matrix.

The transparent electrodes and the back electrodes are misaligned from each other and electrically connected with each other through the connection wires. Accordingly, the solar cells may be electrically connected to each other in series.

As described above, in order to convert the solar light into electrical energy, various solar cell apparatuses have been fabricated and used. One of the solar cell apparatuses is disclosed in Korean Unexamined Patent Publication No. 10-2008-0088744.

DISCLOSURE OF INVENTION

Technical Problem

The embodiment provides a solar cell apparatus, capable of preventing a short phenomenon with improved performance, and a method of fabricating the same.

Solution to Problem

According to the embodiment, there is provided a solar cell apparatus. The solar cell apparatus includes a back electrode layer on a substrate, a light absorbing layer on the back electrode layer, a buffer layer on the light absorbing layer, a front electrode layer on the buffer layer, and a connection part making contact with the front electrode layer, passing through the light absorbing layer, and making contact with the back electrode layer. The connection part includes a material different from a material constituting the front electrode layer.

According to the embodiment, there is provided a method of fabricating the solar cell. The method includes forming a back electrode layer on a substrate, forming a light absorbing layer on the back electrode layer, forming a buffer layer on the light absorbing layer, forming a front electrode layer on the buffer layer, forming a second through hole passing through the light absorbing layer, the buffer layer, and the front electrode layer after forming the front electrode layer, and forming a connection part in the second through hole. The connection part includes a material different from a material constituting the front electrode layer.

Advantageous Effects of Invention

According to the present embodiment, a dead zone may be reduced by the second and third through holes TH2 and TH3. Accordingly, the density of short current can be improved, so that the photo-electric conversion efficiency can be improved.

In addition, after a thin film deposition process has been finished, the first to third through holes are formed at once, so that the process time and the cost can be reduced. In addition, since the first to third through holes are formed after the thin film deposition process has been finished, the oxidation of the back electrode layer and the front electrode layer can be minimized. According, the contact resistance and the serial resistance can be reduced, and the fill factor can be increased.

Meanwhile, the insulating part is provided in the first through holes. Accordingly, the leakage current can be reduced, and the fill factor can be increased.

According to the method of fabricating the solar cell apparatus of the embodiment, after the thin film deposition process has been finished, since the first to third through holes are patterned after the support substrate has been completely heat-distorted, the application of the offset value is not required.

MODE FOR THE INVENTION

Figure 1:
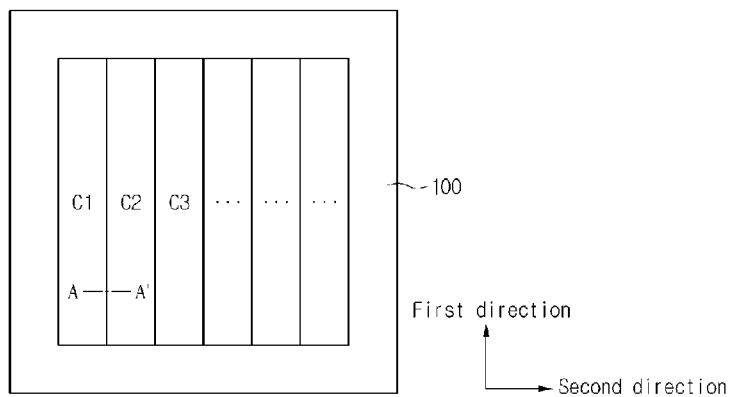
FIG. 1 is a plan view showing the panel of a solar cell apparatus according to the first embodiment.

In the description of the embodiments, it will be understood that, when a layer (film), a region, a pattern, or a structure, is referred to as being "on" or "under" another substrate, another layer (film), another region, another pad, or another pattern, it can be "directly" or "indirectly" on the other substrate, the other layer (film), the other region, the other pad, or the other pattern, one or more intervening layers may also be present. Such a position of each layer has been described with reference to the drawings.

The thickness and size of each layer (film), each region, each pattern, or each structure shown in the drawings may be exaggerated, omitted or schematically drawn for the purpose of convenience or clarity. In addition, the size of each layer (film), each region, each pattern, or each structure does not utterly reflect an actual size.

Hereinafter, the embodiment of the disclosure will be described in detail with reference to accompanying drawings.

First, hereinafter, the solar cell apparatus according to the first embodiment will be described in detail. FIG. 1 is a plan view showing the panel of a solar cell apparatus according to the first embodiment, and FIG. 2 is a sectional view taken along line A-A' of FIG. 1.

Figure 2:
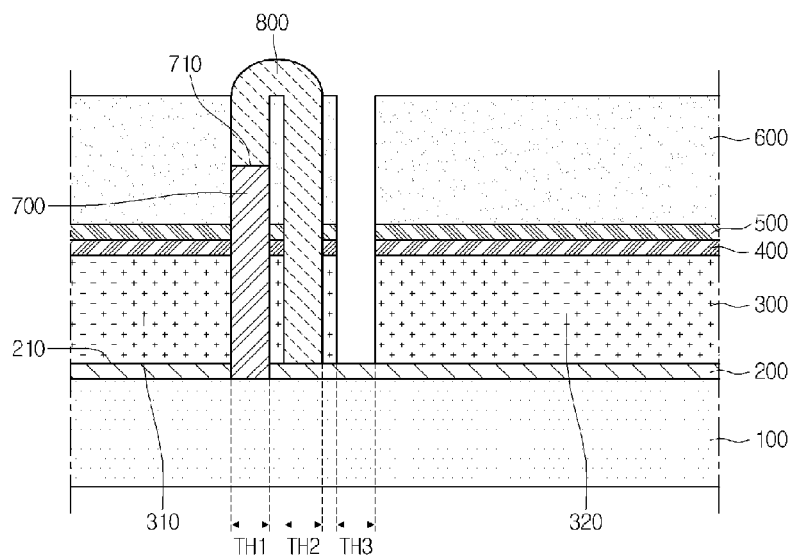
FIG. 2 is a sectional view taken along line A-A' of FIG. 1.

Referring to FIGS. 1 and 2, the solar cell apparatus includes a support substrate 100, a back electrode layer 200, a light absorbing layer 300, a buffer layer 400, a high resistance buffer layer 500, a front electrode layer 600, an insulating part 700, and a plurality of connection parts 800.

The support substrate 100 has a plate shape and supports the back electrode layer 200, the light absorbing layer 300, the buffer layer 400, the high resistance buffer layer 500, the front electrode layer 600, and the connection part 800.

The support substrate 100 may be an insulator. The support substrate 100 may be a glass substrate, a plastic substrate or a metal substrate. In detail, the support substrate 100 may be a soda lime glass substrate. The support substrate 100 may be transparent. The support substrate 100 may be rigid or flexible.

The back electrode layer 200 is provided on the support substrate 100. The back electrode layer 200 is a conductive layer. For example, a material constituting the back electrode layer 200 may include metal such as molybdenum (Mo).

The back electrode layer 200 may include two or more layers. In this case, the layers may be formed by the same metal or different metals.

The back electrode layer 200 is provided therein with first through holes TH1. The first through holes TH1 pass through the back electrode layer 200, the light absorbing layer 300, the buffer layer 400, and the front electrode layer 600. The first through holes TH1 are open regions to expose the top surface of the support substrate 100. When viewed in a plan view, first through holes TH1 may have a shape extending in one direction.

The first through holes TH1 may have a width in the range of about 80 μm to about 200 μm.

The back electrode layer 200 is divided into a plurality of back electrodes by the first through holes TH1. In other words, the back electrodes are defined by the first through holes TH1.

The back electrodes are spaced apart from each other by the first through holes TH1. The back electrodes are arranged in the form of a stripe.

In addition, the back electrodes may be arranged in the form of a matrix. In this case, when viewed in a plan view, the first through holes TH1 may be provided in the form of a lattice.

Meanwhile, the insulating part 700 is provided in the first through holes TH1. In addition, a portion of the connection part 800 may be provided in the first through holes TH1. In detail, the connection part 800 may be provided on the insulating part 700. Accordingly, leakage current can be reduced, and a fill factor can be increased.

A top surface 710 of the insulating part 700 is higher than a top surface 210 of the back electrode layer. Accordingly, the back electrode layer 200 may be insulated from the connection part 800. The insulating part 700 may include polymer or a ceramic material.

The light absorbing layer 300 is provided on the back electrode layer 200.

The light absorbing layer 300 includes a group I-III-VI compound. For example, the light absorbing layer 300 may have the CIGSS (Cu(IN,Ga)(Se,S)2) crystal structure, the CISS (Cu(IN)(Se,S)2) crystal structure or the CGSS (Cu(Ga)(Se,S)2) crystal structure.

The energy bandgap of the light absorbing layer 300 may be in the range of about 1 eV to about 1.8 eV.

The buffer layer 400 is provided on the light absorbing layer 300. The buffer layer 400 includes cadmium sulfide (CdS). The energy bandgap of the buffer layer 400 may be in the range of about 2.2 eV to about 2.4 eV.

The high resistance buffer layer 500 is provided on the buffer layer 400. The high resistance buffer layer 500 includes i-ZnO which is not doped with impurities. The energy bandgap of the high resistance buffer layer 500 may be in the range of about 3.1 eV to about 3.3 eV.

The light absorbing layer 300, the buffer layer 400, the high resistance buffer layer 500, and the front electrode layer 600 are formed therein with second through holes TH2. The second through holes TH2 pass through the light absorbing layer 300, the buffer layer 400, the high resistance buffer layer 500, and the front electrode layer 600. In addition, the second through holes TH2 are open regions to expose the top surface of the back electrode layer 200.

The second through holes TH2 are adjacent to the first through holes TH1. In other words, when viewed in a plan view, portions of the second through holes TH2 are formed beside the first through holes TH1. The second through holes TH2 have a shape extending in a first direction.

Each second through hole TH2 may have a width in the range of about 80 μm to about 200 μm.

A plurality of light absorbing parts 310, 320, . . . , and N are defined in the light absorbing layer 300 by second through holes TH2. In other words, the light absorbing layer 300 is divided into the light absorbing parts 310, 320, . . . , N by the second through holes TH2.

A plurality of buffers are defined in the buffer layer 400 by the second through holes TH2. In other words, the buffer layer 400 is divided into a plurality of buffers by the second through holes TH2.

A plurality of high resistance buffers are defined in the high resistance buffer layer 500 by the second through holes TH2. In other words, the high resistance buffer layer 500 is divided into the high resistance buffers by the second through holes TH2.

The front electrode layer 600 is provided on the high resistance buffer layer 500. The front electrode layer 600 is transparent, and includes a conductive layer. In addition, the front electrode layer 600 has resistance greater than that of the back electrode layer 200.

The front electrode layer 600 includes an oxide. For example, the front electrode layer 600 may include an Al doped zinc oxide (AZO), or a Ga doped zinc oxide (GZO).

The front electrode layer 600 has a thickness in the range of about 0.5 µm to about 1.5 µm. The front electrode layer 600 is divided into a plurality of front electrodes by the second through holes TH2. That is, the front electrodes are defined by the second through holes TH2. Third through holes TH3 are formed beside the second through holes TH2. The third through holes TH3 expose the top surface 210 of the back electrode layer 200 and passe through the light absorbing layer 300.

The front electrodes have a shape corresponding to that of the back electrodes. In other words, the front electrodes are disposed in the form of a stripe. Alternatively, the front electrodes may be disposed in the form of a matrix.

In addition, a plurality of cells C1, C2, . . . , and Cn are defined by the second through holes TH2. In more detail, the solar cell apparatus according to the embodiment is divided into the cells C1, C2, . . . , and Cn by the second through holes TH2. In addition, the cells C1, C2, . . . , and Cn are connected to each other in a second direction crossing a first direction. In other words, current may flow in the second direction through the cells C1, C2, . . . , and Cn.

The connection parts 800 are provided at the inside of the second through holes TH2. In addition, a portion of the connection part 800 may be provided in the first through holes TH1. In other words, the portion of the connection part 800 may be provided on the insulating part 700.

Each connection part 8700 extends downward from the front electrode layer 600 and is connected to the back electrode layer 200. In detail, the connection parts 800 make contact with the front electrode layer 600. The connection parts 800 pass through the light absorbing layer 300 while being connected to the back electrode layer 200. For example, each connection part 800 extends from a front electrode of the first cell C1 and is connected to a back electrode of the second cell C2.

Thus, the connection parts 800 connect adjacent cells to each other. In more detail, the connection parts 800 connect front electrodes and back electrodes included in adjacent C1, C2, . . . , and Cn to each other.

The connection part 800 includes a material different from that of the front electrode layer 600. In detail, the connection part 800 may include metal. For example, the connection part 800 may include aluminum (Al), nickel (Ni), or silver (Ag).

According to the present embodiment, a dead zone may be reduced by the second and third through holes TH2 and TH3. Accordingly, the density of short current can be improved, so that the photo-electric conversion efficiency can be improved.

In addition, as described above, the first to third through holes TH1, TH2, and TH3 are formed after performing a deposition process up to the front electrode layer 600. In other words, after a thin film deposition process has been finished, the first to third through holes TH1 to TH3 are formed at once, so that the process time and the cost can be reduced. In addition, since the first to third through holes TH1 to TH3 are formed after the thin film deposition process has been finished, the oxidation of the back electrode layer 200 and the front electrode layer 600 can be minimized. Accordingly, the contact resistance and the serial resistance can be reduced, and the fill factor can be increased. In other words, according to the related art, the first through holes TH1 are formed during the deposition process, and the stand-by time for a process is increased, so that the contact resistance is increased due to the oxidation of the back electrode layer 200 and the front electrode layer 600.

Hereinafter, a solar cell apparatus according to the second embodiment will be described with reference to FIG. 3. For the clear and brief explanation, the detail of the components the same as or similar to those of the first embodiment will be omitted in order to avoid redundancy.

Figure 3:
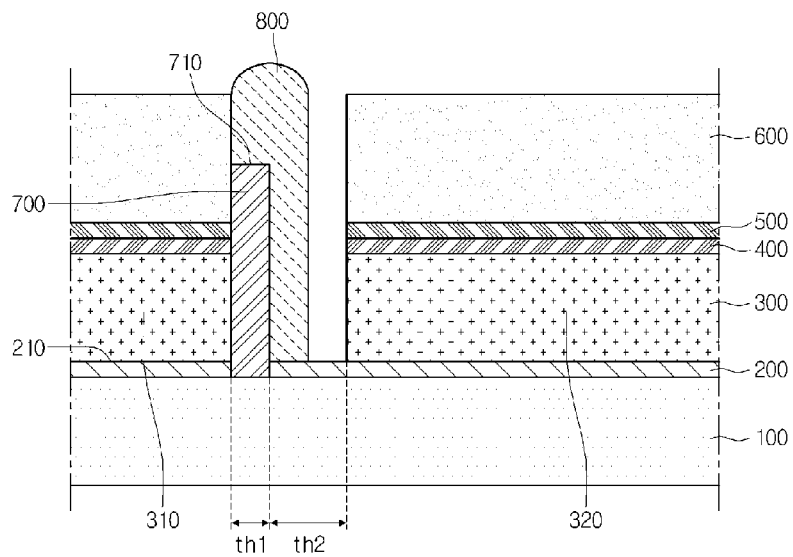
FIG. 3 is a sectional view showing the panel of a solar cell apparatus according to the second embodiment.

FIG. 3 is a sectional view showing the panel of a solar cell apparatus according to the second embodiment.

Referring to FIG. 3, the second through holes (reference numeral TH2 of FIG. 2) and the third through holes (reference numeral TH3 of FIG. 2) according to the first embodiment are overlapped with each other to form second through holes th2. The connection part 800 may be provided in a portion of the second through holes the2.

Hereinafter, a method of fabricating the solar cell apparatus according to the first embodiment will be described with reference to FIGS. 4 to 8. FIGS. 4 to 8 are sectional views showing the fabricating process of the panel of the solar cell apparatus according to the first embodiment.

Figure 4:
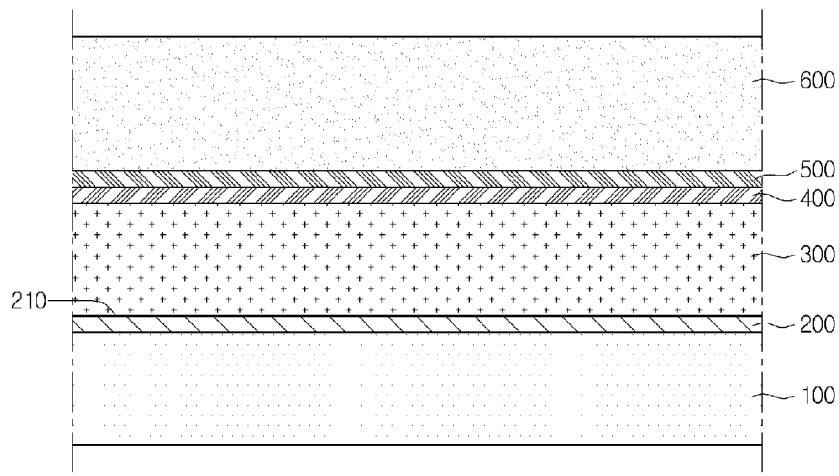
FIGS. 4 to 8 are sectional views showing the fabricating process of the panel of the solar cell apparatus according to the first embodiment.

First, referring to FIG. 4, the back electrode layer 200 is formed on the support substrate 100. The back electrode layer 200 may include molybdenum (Mo). The back electrode layer 200 may be formed with at least two layers through processes different from each other.

A step of forming the light absorbing layer 300 on the back electrode layer 200 is performed. The light absorbing layer 300 may be formed through a sputtering process or an evaporation scheme.

For example, in order to form the light absorbing layer 300, various schemes such as a scheme of forming a Cu(In,Ga)Se2 (CIGS) based-light absorbing layer 300 by simultaneously or separately evaporating Cu, In, Ga, and Se and a scheme of performing a selenization process after forming a metallic precursor film have been extensively performed.

Regarding the details of the selenization process after forming the metallic precursor layer, the metallic precursor layer is formed on the back contact electrode 200 through a sputtering process employing a Cu target, an In target, or a Ga target.

Thereafter, the metallic precursor layer is subject to the selenization process so that the Cu(In,Ga)Se2 (CIGS) based-light absorbing layer 300 is formed.

In addition, the sputtering process employing the Cu target, the In target, and the Ga target and the selenization process may be simultaneously performed.

In addition, a CIS or a CIG light absorbing layer 300 may be formed through a sputtering process employing only Cu and In targets or only Cu and Ga targets and the selenization process.

Thereafter, the buffer layer 400 may be formed after depositing CdS through a sputtering process or a CBD (chemical bath deposition) scheme.

Thereafter, the high resistance buffer layer 500 is formed by depositing zinc oxide on the buffer layer 400 through a sputtering process.

The buffer layer 400 and the high resistance buffer layer 500 are deposited at a low thickness. For example, the thicknesses of the buffer layer 400 and the high resistance buffer layer 500 may be in the range of about 1 nm to about 80 nm.

A step of forming the front electrode layer 600 on the high resistance buffer layer 500 is performed. The front electrode layer 600 may be formed by depositing a transparent conductive material such as Al doped zinc oxide (AZO) on the high resistance buffer layer 500 through a sputtering process.

Figure 5:
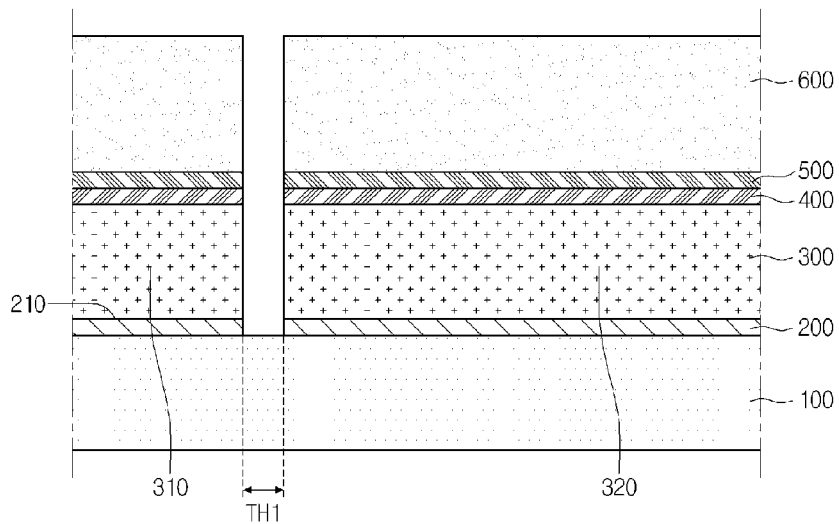

Thereafter, referring to FIG. 5, a step of forming the first through holes TH1 passing through the back electrode layer 200, the light absorbing layer 300, the buffer layer 400, and the front electrode layer 600 is performed. The first through holes TH1 may be formed by a mechanical device such a tip. In other words, the back electrode layer 200, the light absorbing layer 300, the buffer layer 400, and the front electrode layer 600 may be mechanically patterned by a tip. The width of the tip may be in the range of about 40 μm to about 180 μm.

Figure 6:
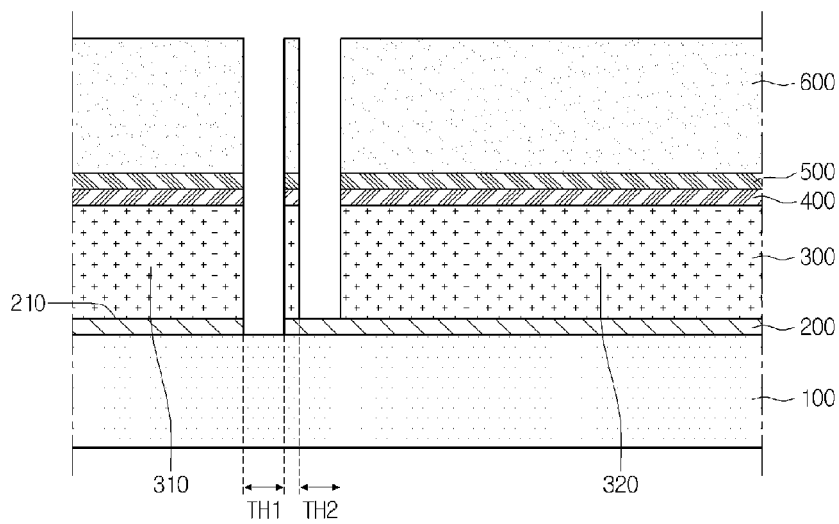

Subsequently, referring to FIG. 6, a step of forming the second through holes TH2 passing through the light absorbing layer 300, the buffer layer 400, and the front electrode layer 600 is performed after the forming the front electrode layer 600. The second through holes TH2 may be formed adjacent to the first through holes TH1. The second through holes TH2 may be patterned by a laser.

Figure 7:
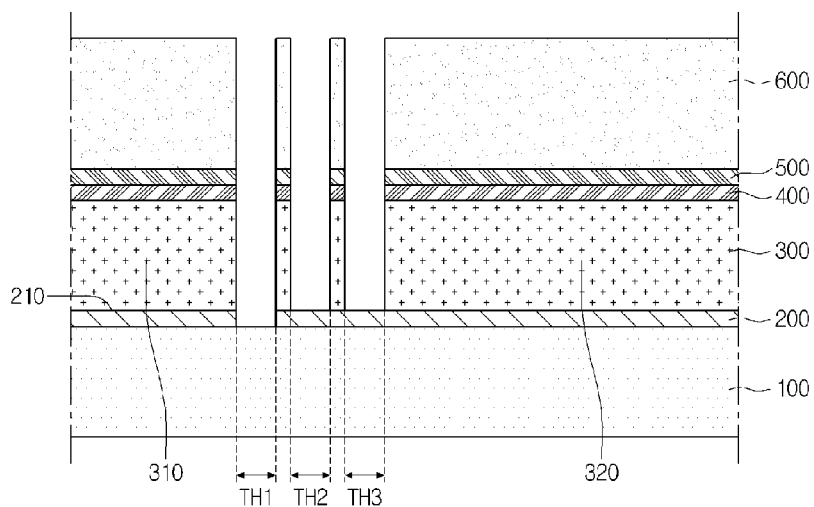

Thereafter, referring to FIG. 7, the third through holes TH3 may be formed beside the second through holes TH2 to expose the top surface 210 for the back electrode layer 200 while passing through the light absorbing layer 300. The third through holes TH3 may be patterned by a laser.

Figure 8:
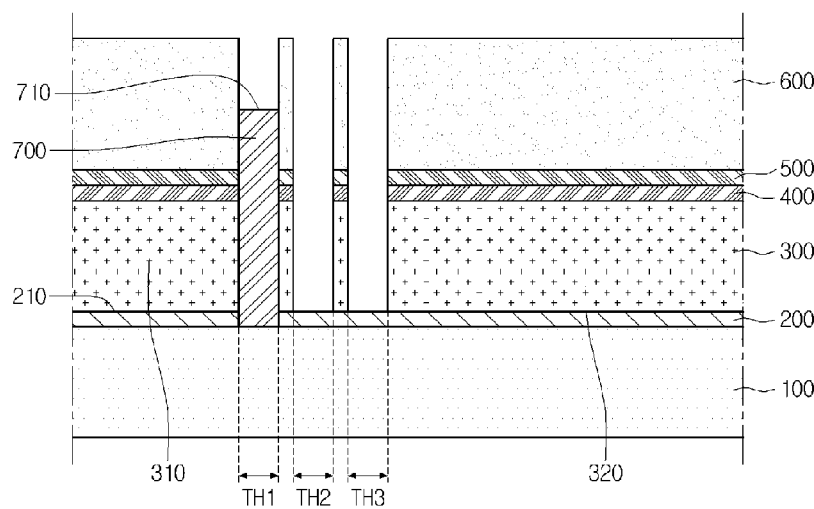

Thereafter, referring to FIG. 8, the insulating part 700 may be formed in the first through holes TH1. The top surface 710 of the insulating part 700 may be formed higher than the top surface 210 of the back electrode layer 200. The insulating part 700 may be formed by inserting an insulating material including polymer or a ceramic material into the first through holes TH1 through a screen printing scheme or a dispenser. Thereafter, a binder may be removed from the insulating material by curing the insulating material.

Thereafter, referring to FIG. 2, the connection part 800 may be formed on the top surface of the insulating part 700 and formed in the second through holes TH2. In the step of forming the connection part 800, metallic paste formed by mixing metal and an organic binder may be inserted into the second through holes TH2. The metallic paste may be inserted through a screen printing scheme or a dispenser.

Thereafter, a step of curing the metallic paste is performed. The step of curing the metallic paste may be performed at the temperature of 250° C. or less. In addition, the step of curing the metallic paste may be performed for 30 minutes or less. Through the step of curing the metallic paste, the binder may be removed from the metallic paste.

The dead zone can be reduced through the second and third through holes TH2 and TH3. Accordingly, the density of short current can be improved, so that the photo-electric conversion efficiency can be improved.

In addition, after the thin film deposition process has been finished, since the first to third through holes TH1 to TH3 are patterned after the support substrate 100 has been completely heat-distorted, the application of the offset value is not required.

Hereinafter, the method of fabricating the solar cell apparatus according to the second embodiment will be described with reference to FIGS. 9 to 11.

Figure 9:
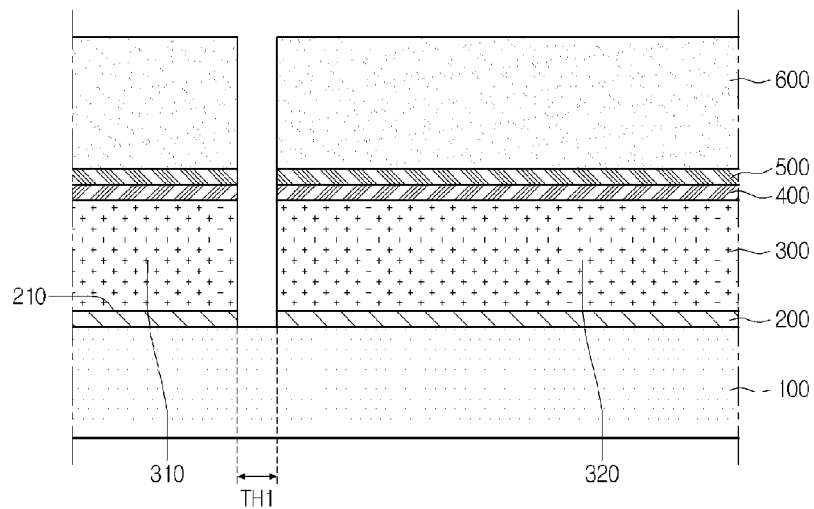
FIGS. 9 to 11 are sectional views showing the fabricating process of the panel of the solar cell apparatus according to the second embodiment.
Figure 10:
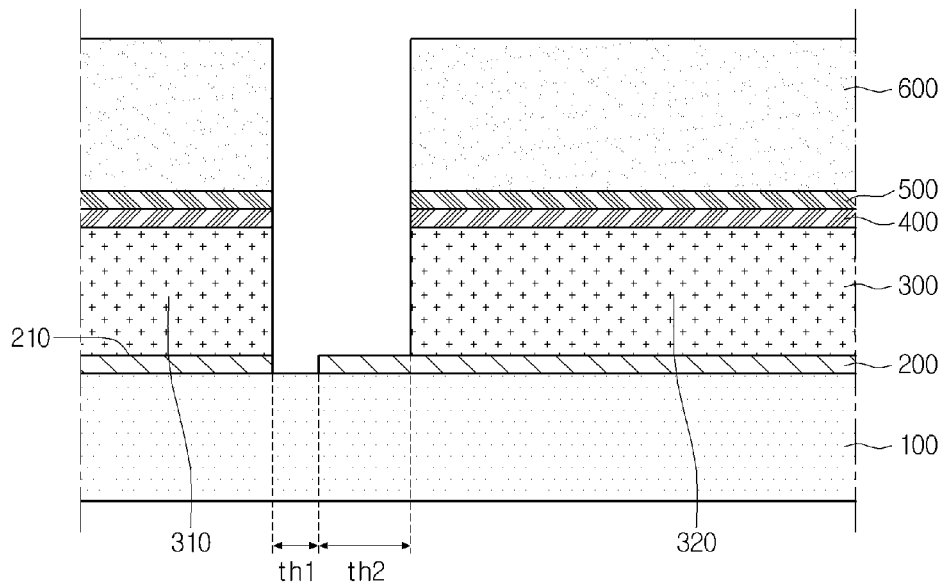
Figure 11:
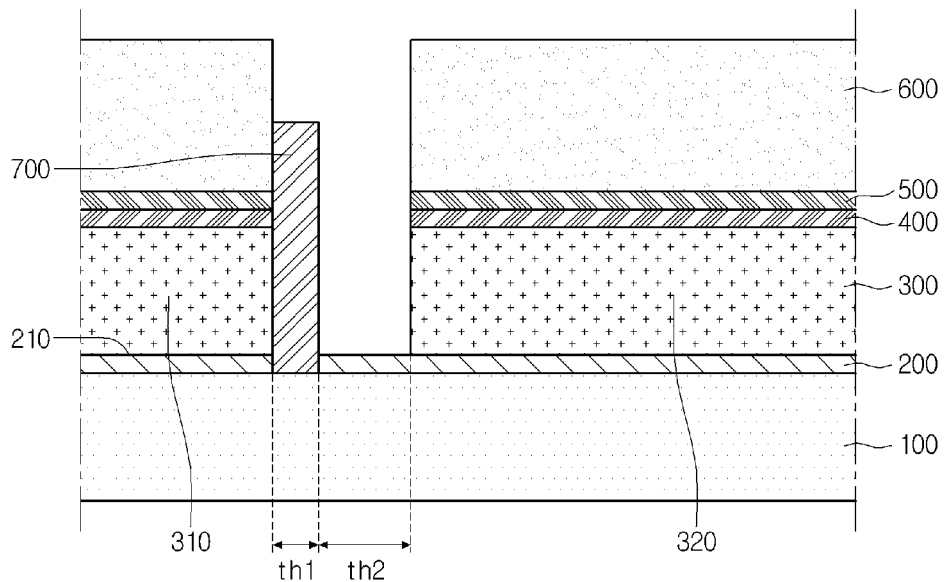

FIGS. 9 to 11 are sectional views showing the fabricating process of the panel of the solar cell apparatus according to the second embodiment.

Referring to FIG. 9, a step of forming the first through holes th1 passing through the back electrode layer 200, the light absorbing layer 300, the buffer layer 400, and the front electrode layer 600 is performed.

Thereafter, referring to FIG. 10, a step of forming the second through holes th2 beside the first through holes th1 is performed. The second through holes th2 may pass through the light absorbing layer 300, the buffer layer 400, and the front electrode layer 600.

Then, referring to FIG. 11, the insulating part 700 may be formed in the first through holes th1. Subsequently, referring to FIG. 3, the connection part 800 may be formed on the top surface 710 of the insulating part 700 and formed in a portion of the second through holes th2.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell apparatus comprising:
   a back electrode layer on a substrate;
   a light absorbing layer on the back electrode layer;
   a buffer layer on the light absorbing layer;
   a front electrode layer on the buffer layer;
   a connection part making contact with the front electrode layer, passing through the light absorbing layer, and making contact with the back electrode layer;
   a first hole passing through the back electrode layer, the light absorbing layer, the buffer layer, and the front electrode layer; and
   a second hole formed adjacent to the first hole while passing through the light absorbing layer,
   wherein the connection part includes a material different from a material constituting the front electrode layer;
   wherein an insulating part is provided in the first hole;
   wherein a top surface of the insulating part is higher than a top surface of the back electrode layer;
   wherein the connection part is formed in the second hole and on the insulating part of the first hole;
   wherein the substrate comprises glass; and
   wherein a part of the back electrode layer is insulated from the connection part by the insulating part.

2. The solar cell apparatus of claim 1, wherein the connection part includes metal.

3. The solar cell apparatus of claim 2, wherein the connection part includes aluminum (Al), nickel (Ni), or silver (Ag).

4. The solar cell apparatus of claim 1, wherein the insulating part includes a polymer or a ceramic material.

5. The solar cell apparatus of claim 1, wherein a portion of the connection part is provided in the first hole.

6. The solar cell apparatus of claim 5, wherein the second hole is overlapped with a third hole.

7. The solar cell apparatus of claim 1, further comprising a third hole formed beside the second hole while passing through the light absorbing layer.

\* \* \* \* \*